United States Patent
Paraschou et al.

(10) Patent No.: US 10,692,545 B2
(45) Date of Patent: Jun. 23, 2020

(54) LOW POWER VTT GENERATION MECHANISM FOR RECEIVER TERMINATION

(71) Applicant: Advanced Micro Devices, Inc., Santa Clara, CA (US)

(72) Inventors: Milam Paraschou, Dellwood, MN (US); Balwinder Singh, Union City, CA (US); Gerald R. Talbot, Concord, MA (US); Alushulla Jack Ambundo, Austin, TX (US); Edoardo Prete, Arlington, MA (US); Thomas H. Likens, III, Austin, TX (US); Michael A. Margules, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/140,356

(22) Filed: Sep. 24, 2018

(65) Prior Publication Data

US 2020/0098399 A1    Mar. 26, 2020

(51) Int. Cl.
*G11C 7/10* (2006.01)
*G11C 5/14* (2006.01)
(Continued)

(52) U.S. Cl.
CPC .......... *G11C 5/147* (2013.01); *G11C 11/4074* (2013.01); *H03K 17/687* (2013.01); *H04L 25/0292* (2013.01)

(58) Field of Classification Search
CPC .................................................... G11C 7/1084
(Continued)

(56) References Cited

U.S. PATENT DOCUMENTS

| 3,795,901 A | 3/1974 | Boehm et al. |
| 4,689,620 A | 8/1987 | Wondrak |

(Continued)

OTHER PUBLICATIONS

Singh et al., U.S. Appl. No. 16/140,364, entitled "Pseudo Differential Receiving Mechanism for Single-Ended Signaling", filed Sep. 24, 2018, 24 pages.

(Continued)

*Primary Examiner* — Min Huang
(74) *Attorney, Agent, or Firm* — Kowert Hood Munyon Rankin and Goetzel PC; Rory D. Rankin (57) ABSTRACT

Systems, apparatuses, and methods for performing efficient data transfer in a computing system are disclosed. A termination voltage generator includes an inverter-based chopper circuit, which uses a first group of an even number of serially connected inverters coupled between the output node of the chopper circuit and the gate terminal of an output pmos transistor. Additionally, a second group of an even number of serially connected inverters is coupled between the output node and the gate terminal of an output nmos transistor. A replica inverter includes two serially connected pmos transistors and two serially connected nmos transistors. Each of one pmos transistor and one nmos transistor receives a generated voltage set as the expected value of the termination voltage. Each of the other pmos transistor and nmos transistor receives an output based on a comparison between the expected value to the output of the replica inverter.

20 Claims, 9 Drawing Sheets

(51) Int. Cl.
*G11C 11/4074* (2006.01)
*H04L 25/02* (2006.01)
*H03K 17/687* (2006.01)

(58) Field of Classification Search
USPC .................................................. 365/189.11
See application file for complete search history.

(56) References Cited

U.S. PATENT DOCUMENTS

| | | | |
|---|---|---|---|
| 5,610,414 A * | 3/1997 | Yoneda | G09G 3/3611 |
| | | | 257/99 |
| 5,694,427 A | 12/1997 | Wincn | |
| 5,963,484 A | 10/1999 | Jung | |
| 6,504,420 B1 | 1/2003 | Vorenkamp et al. | |
| 6,720,804 B2 | 4/2004 | Taguchi et al. | |
| 6,937,111 B2 | 8/2005 | Kwon | |
| 6,944,071 B2 | 9/2005 | Martin | |
| 6,972,607 B1 | 12/2005 | Chen et al. | |
| 6,992,501 B2 | 1/2006 | Rapport | |
| 7,034,565 B2 | 4/2006 | Lee | |
| 7,095,217 B1 | 8/2006 | Niculae et al. | |
| 7,099,395 B1 | 8/2006 | Sidiropoulos et al. | |
| 8,164,362 B2 | 4/2012 | Afghahi et al. | |
| 8,344,808 B2 | 1/2013 | Samavedam et al. | |
| 8,710,810 B1 | 4/2014 | McJimsey et al. | |
| 2003/0234674 A1 * | 12/2003 | Morgan | H03K 5/133 |
| | | | 327/290 |
| 2004/0264230 A1 * | 12/2004 | Brand | H04L 25/0288 |
| | | | 365/145 |
| 2006/0117155 A1 | 6/2006 | Ware et al. | |
| 2008/0029824 A1 * | 2/2008 | Baizley | H01L 27/0266 |
| | | | 257/371 |
| 2009/0256587 A1 | 10/2009 | Kuboyama et al. | |
| 2010/0164622 A1 | 7/2010 | Ge et al. | |
| 2012/0197568 A1 * | 8/2012 | Souma | G01R 31/2824 |
| | | | 702/65 |
| 2014/0140419 A1 | 5/2014 | Poulton et al. | |
| 2015/0002189 A1 * | 1/2015 | Dietl | H03K 19/0013 |
| | | | 326/30 |
| 2017/0169868 A1 | 6/2017 | Huang et al. | |
| 2017/0288434 A1 | 10/2017 | Narita | |

OTHER PUBLICATIONS

Gonzales et al., U.S. Appl. No. 16/118,054, entitled "Low Loss T-Coil Configuration With Frequency Boost for an Analog Receiver Front End", filed Aug. 30, 2018, 29 pages.

Non-Final Office Action in U.S. Appl. No. 16/140,364, dated Jul. 18, 2019, 6 pages.

Non-Final Office Action in U.S. Appl. No. 16/118,054, dated Apr. 30, 2019, 12 pages.

Tyan, Eer-Wen, U.S. Appl. No. 11/147,002, entitled "Low power termination circuit", filed Jun. 7, 2005, 15 pages.

Notice of Allowance in in U.S. Appl. No. 16/118,054, dated Aug. 21, 2019, 10 pages.

International Search Report and Written Opinion in International Application No. PCT/US2019/039395, dated Sep. 30, 2019, 13 pages.

* cited by examiner

LOW POWER VTT GENERATION MECHANISM FOR RECEIVER TERMINATION

BACKGROUND

Description of the Related Art

When transferring information between functional blocks in a semiconductor chip, electrical signals are sent on multiple, parallel metal traces. Transmitters in a first functional block send the electrical signals across the parallel metal traces. Receivers in a second functional block receive the electrical signals. In some cases, the two functional blocks are within a same die. In other cases, the two functional blocks are on separate dies. In either case, the metal traces have transmission line effects such as distributed inductance, capacitance and resistance throughout its length. For modern integrated circuits, the interconnect capacitance reduces signal integrity and signal transfer rate more so than gate capacitance of semiconductor devices.

The interconnect capacitance per unit length includes both sidewall fringing capacitance and cross-coupling capacitance. For example, the electromagnetic fields for the metal traces conducting signals and the return current on the ground plane create electrical interference on neighboring metal traces and on adjacent devices. As the operating voltage continue to decrease to reduce power consumption, the signal swing used for Boolean logic decreases as well as the noise margin.

In view of the above, efficient methods for receiving information as signals in a computing system are desired.

BRIEF DESCRIPTION OF THE DRAWINGS

The advantages of the methods and mechanisms described herein may be better understood by referring to the following description in conjunction with the accompanying drawings, in which.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION OF EMBODIMENTS

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Various systems, apparatuses, methods, and computer-readable mediums for generating a termination voltage in a computing system are disclosed. In various embodiments, a computing system includes one or more functional blocks for processing applications. Examples of the functional blocks include a general-purpose central processing unit (CPU), a graphics processing unit (GPU), an accelerated processing unit (APU), an input/output (I/O) device, a memory controller for system memory, and so forth. The computing system also includes multiple interfaces for transferring data between the functional blocks. In some cases, two functional blocks transferring data between one another are within a same die. In other cases, the two functional blocks are on separate dies.

When transferring information between functional blocks, electrical signals are sent on multiple, parallel metal traces. Transmitters in a first functional block send the electrical signals across the parallel metal traces. Receivers in a second functional block receive the electrical signals. The metal traces have transmission line effects, such as distributed inductance, capacitance and resistance throughout the line length. To reduce signal reflection, the far end (receiving end) of the metal traces are terminated using the characteristic impedances of the metal traces. In some embodiments, on-die termination (ODT) is used where at least a termination resistor for impedance matching is located inside the receiver instead of externally from the receiver such as on a printed circuit board (PCB) or off-die on a system on a chip (SOC) or multichip module (MCM).

In addition to terminating the metal trace at the receiver, each receiver includes sampling circuitry for receiving the input signal after the termination circuitry and the electrostatic discharge (ESD) protection circuitry. The sampling circuitry reconstructs the input signal by comparing the received input signal to a reference voltage. In various embodiments, a termination voltage generator sends a termination voltage to multiple receivers. In some embodiments, the termination voltage generator uses an inverter-based chopper circuit for generating the termination voltage, which is provided on both the input and the output of the chopper circuit. In an embodiment, a first group of an even number of serially connected inverters is coupled between the output node of the chopper circuit and a gate terminal of an output pmos transistor (p-type metal oxide semiconductor field effect transistor). Additionally, a second group of an even number of serially connected inverters is coupled between the output node and a gate terminal of an output nmos transistor (n-type metal oxide semiconductor field effect transistor).

In some embodiments, an inverter of the above first group includes two serially connected pmos transistors and two serially connected nmos transistors, rather than includes the typical configuration with a single pmos transistor and a single nmos transistor. A first pmos transistor of the two serially connected pmos transistors receives on its gate terminal an output voltage on the output node of the chopper circuit and has its drain terminal coupled to the output node of the chopper circuit.

A second pmos transistor of the two serially connected pmos transistors has its drain terminal coupled to the source terminal of the first pmos transistor and has its source terminal coupled to the power supply voltage. The second pmos transistor receives on its gate terminal a value different from an output voltage on the output node of the chopper circuit. This different value is described below. The two serially connected nmos transistors are arranged in a similar manner, but the ground reference voltage is used rather than the power supply voltage. In various embodiments, similar to this inverter of the first group, an inverter of the above second group includes two serially connected pmos transistors and two serially connected nmos transistors, rather than includes the typical configuration with a single pmos transistor and a single nmos transistor. The terminal connections are similar to the connections used in the first group.

To generate the above value different from the output of the chopper circuit to send to the gate terminals of the second pmos transistors and the second nmos transistors of the serially connected transistors, the termination voltage generator further includes a replica inverter, a voltage divider and a unity gain buffer, in some embodiments. In an embodiment, the voltage divider generates a fraction of the power supply voltage. In one embodiment, the fraction is one half. In various embodiments, the replica inverter includes two serially connected pmos transistors and two serially connected nmos transistors, rather than includes the typical configuration with a single pmos transistor and a single nmos transistor. Each of one pmos transistor and one nmos transistor receives the output of the voltage divider on gate terminals.

The amplifier (unity gain buffer) generates an output based on monitoring the outputs of the voltage divider and the replica inverter. The output of the amplifier is the above value different from the output of the chopper circuit. The output of the amplifier is sent to the gate terminals of the second pmos transistor and the second nmos transistor of serially connected transistors in each of the replica inverter and two of the inverters in the chopper circuit.

Figure 1:
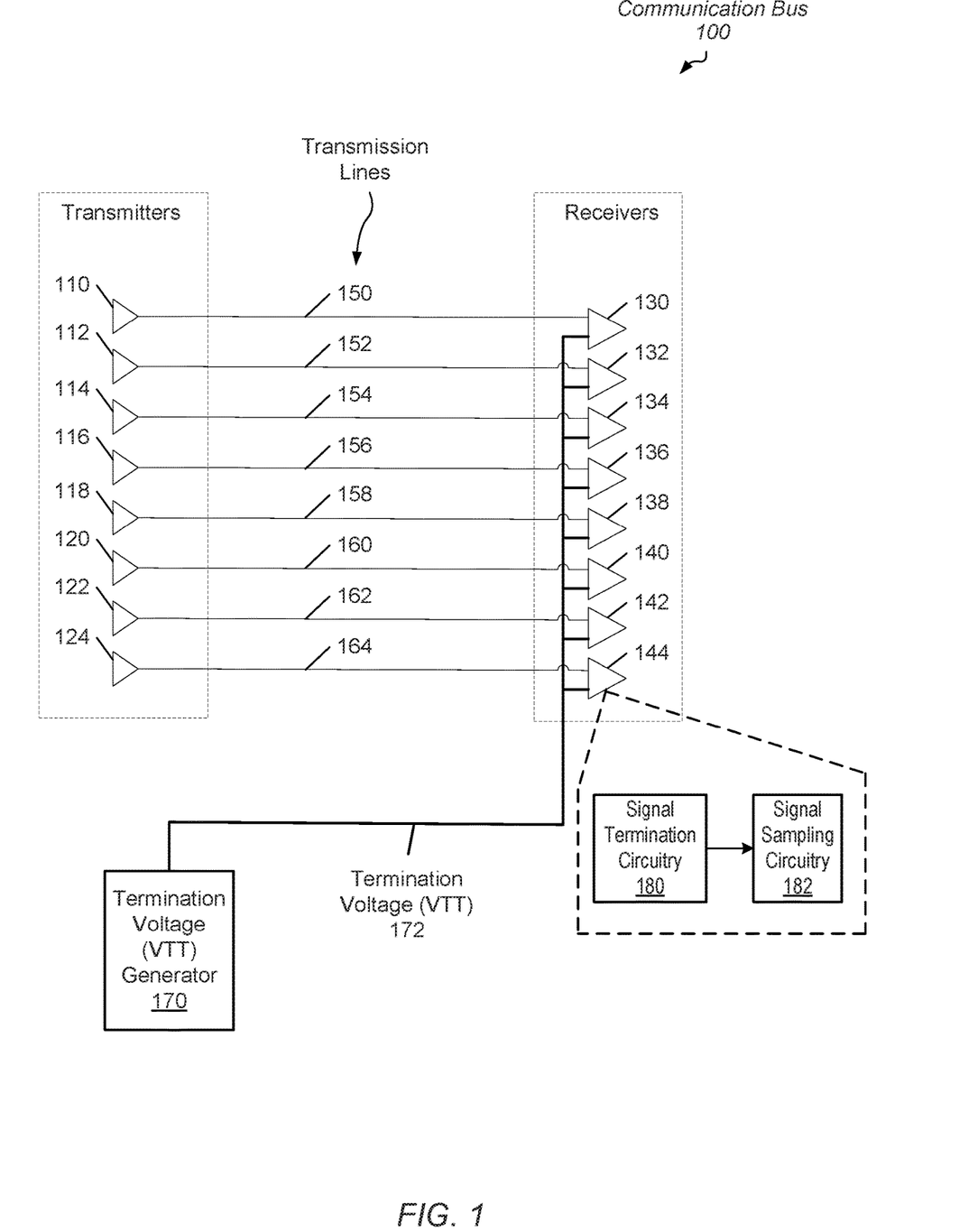
FIG. 1 is a block diagram of one embodiment of a communication bus.

Referring to FIG. 1, a generalized block diagram of one embodiment of a communication bus 100 is shown. As shown, communication bus 100 includes transmitters 110-124 for sending information as electrical signals, transmission lines 150-164 for transferring the electrical signals, and receivers 130-144 for receiving the signals. Additionally, communication bus 100 includes a termination voltage (VTT) generator 170 for generating termination voltage (VTT) 172. As shown, VTT 172 is sent to each of the receivers 130-144. In various embodiments, one or more of the receivers 130-144 uses VTT 172 in both termination circuitry and sampling circuitry. In the illustrated embodiment, receiver 144 couples VTT 172 to each of termination circuitry 180 and sampling circuitry 182.

It is noted that the term "bus" may also be referred to as a "channel," and each "transmission line" is a "lane" or a "trace" or a "wire." In various embodiments, transmission lines 150-164 are constructed from a variety of suitable metal sources during semiconductor fabrication and surrounded by a variety of any suitable insulating material. It is also noted that the terms "pin," "port," "terminal," and "node" are used interchangeably herein. Although eight transmitters 110-124, eight transmission lines 150-164 and eight receivers 130-144 are shown, in other embodiments, any number of these components is used.

In some embodiments, a bus with 40 transmission lines uses communication bus 100 instantiated five times. Accordingly, an average value of VTT 172 is at least partially derived from average transmitter currents being pushed and pulled (sourced and sunk) on transmission lines 150-164 by circuitry in transmitters 110-124. The directions of the transmitter currents on transmission lines 150-164 are based on whether the transmission lines 150-164 are being charged to logic high values or discharged to logic low values. In other words, the direct current (DC) patterns on the transmission lines 150-164 over time partially derive the average value of VTT 172.

In some embodiments, when the bus with 40 transmission lines uses communication bus 100 instantiated five times, each instantiation of communication bus 100 uses a respective VTT generator. The value of VTT 172 in each instantiation is set by the VTT generator in each instantiation. The average value of VTT 172 is partially set by the average transmitter currents being pushed and pulled by the eight transmitters 110-124 charging and discharging the eight transmission lines 150-164. In other embodiments, a single VTT generator, such as VTT generator 170, sends VTT 172 to each of the 40 receivers. In such embodiments, the value of VTT 172 is set by the VTT generator 170. The average value of VTT 172 is partially set by the average transmitter currents being pushed and pulled by the 40 transmitters charging and discharging the 40 transmission lines.

In some embodiments, the signals sent from transmitters 110-124 to receivers 130-144 are single-ended data signals. The term "single-ended signal" is defined as an electric signal which is transmitted using a single signal conductor. For example, in an embodiment, receiver 130 receives a single-ended signal from transmitter 110 via transmission line 150, which is a single signal conductor. In contrast to using single-ended data signals, sending information with differential data signals uses more lines and more pins. A reference signal is not generated and sent to multiple pins (or multiple receivers) when differential data signals are used. As is known in the art, differential signaling generally provides better noise immunity than single-ended signaling. However, the use of differential signaling comes at the added cost of extra pins and extra traces.

In order to better handle noise issues when using single-ended signaling, communication bus 100 uses VTT 172 in each of the signal termination circuitry 180 and the signal sampling circuitry 182. Any noise on one or more of the received input signals on transmission lines 150-164 and any noise on VTT 172 are tracked by each of the signal termination circuitry 180 and the signal sampling circuitry 182. In various embodiments, a capacitance is used within VTT generator 170 to reduce noise on VTT 172 and keep VTT 172 as stable as possible. In some embodiments, the capacitance used within VTT generator 170 is a lumped capacitance, whereas, in other embodiments, this capacitance is a distributed capacitance. By limiting the noise on VTT 172 with this capacitance within VTT generator 170, the common mode noise received by samplers within the receivers 130-144 is also reduced. As shown in FIG. 1, when cross coupling capacitance on transmission lines 150-164 (and additional external transmission lines, in some embodiments) causes VTT 172 to change its value from its generated value, the change is received by VTT generator 170, which adjusts its output.

Figure 2:
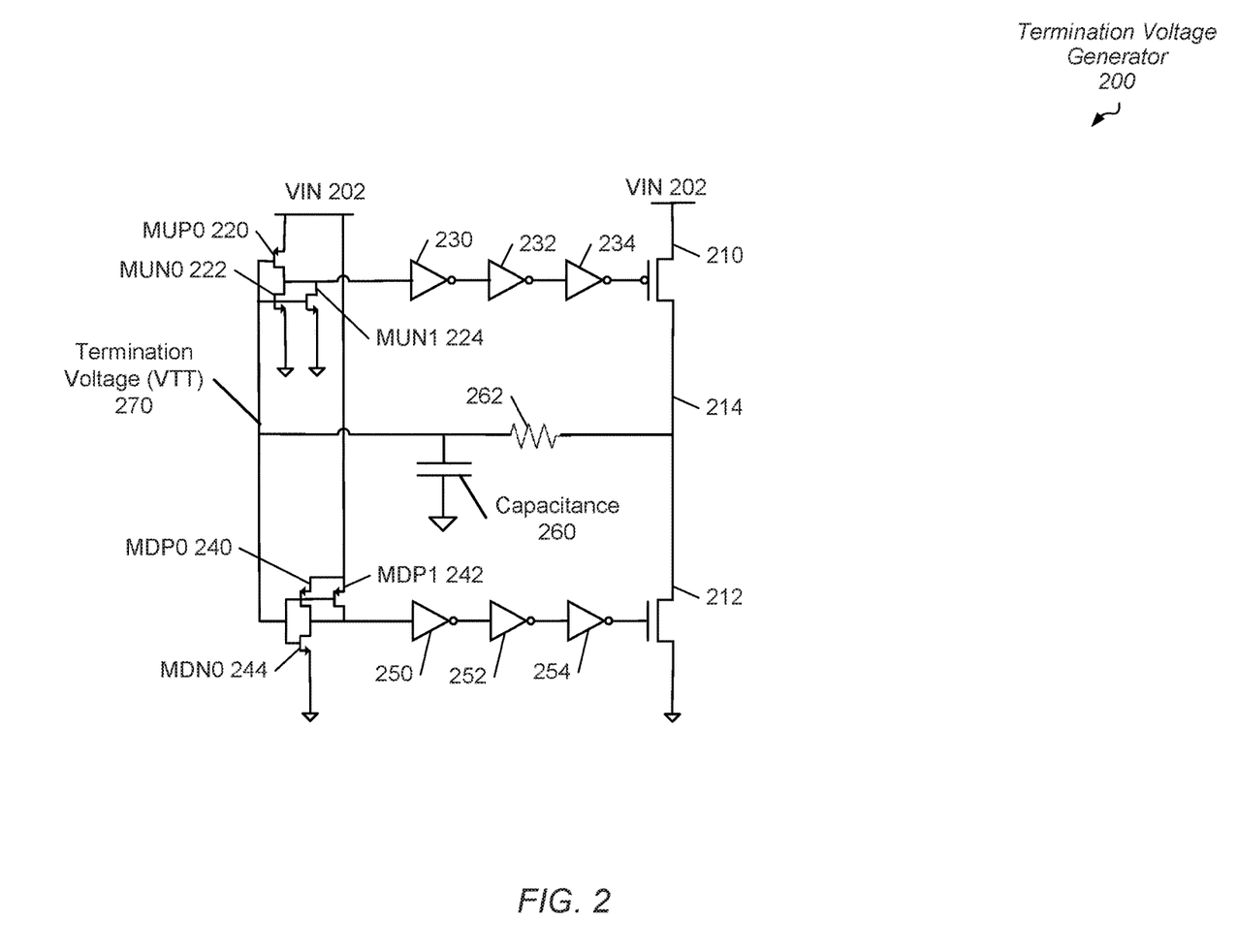
FIG. 2 is a block diagram of one embodiment of a termination voltage generator.

Turning now to FIG. 2, a generalized block diagram of one embodiment of a termination voltage generator 200 is shown. In the illustrated embodiment, termination voltage generator 200 (or generator 200) uses an inverter-based chopper circuit. Each of the pmos transistor 210 and the nmos transistor 212 have drain terminals coupled to the node 214. In some embodiments, a series feedback resistor 262 provides a current-resistance (IR) voltage drop between the drain terminals of pmos transistor 210 and nmos transistor 212 and the gate terminals of transistors 220, 222, 224, 240, 242 and 244. The gate terminals of transistors 220, 222, 224, 240, 242 and 244 are connected to the node with the termination voltage (VTT) 270. In some embodiments, the capacitance 260 is a lumped capacitance. In other embodiments, the capacitance 260 is a distributed capacitance. In various embodiments, the capacitance 260 is used within termination voltage generator 200 to reduce noise on the node with VTT 270 and keep VTT 270 as stable as possible.

In an embodiment, a first group of an even number of serially connected inverters is coupled between the node with VTT 270 and the gate terminal of pmos transistor 210. For example, a first inverter includes pmos transistor MUP0 220, nmos transistor MUN0 222 and nmos transistor MUN1 224. This first inverter in combination with inverters 230, 232 and 234 form the first group. Additionally, a second group of an even number of serially connected inverters is coupled between the node with VTT 270 and the gate terminal of nmos transistor 212. For example, a first inverter includes pmos transistor MDP0 240, pmos transistor MDP1 242 and nmos transistor MDN0 244. This first inverter in combination with inverters 250, 252 and 254 form the second group.

In an embodiment, an inverter in a given stage of the first group has smaller transistor sizes than transistors in an inverter in a next stage receiving an output of the given stage. For example, inverter 230 has smaller transistor sizes than transistors in inverter 232. Additionally, inverter 232 has smaller transistor sizes than transistors in inverter 234. Therefore, relatively small voltage differences detected on VTT 270 are amplified and the gate terminal of pmos transistor 210 receives a full logic value on its gate terminal. In an embodiment, the logic low value is the ground reference voltage. In an embodiment, the logic high value is the power supply voltage VIN 202.

Similar to the above, in an embodiment, an inverter in a given stage of the second group has smaller transistor sizes than transistors in an inverter in a next stage receiving an output of the given stage. For example, inverter 250 has smaller transistor sizes than transistors in inverter 252. Additionally, inverter 252 has smaller transistor sizes than transistors in inverter 254. Therefore, relatively small voltage differences detected on VTT 270 are amplified and the gate terminal of nmos transistor 212 receives a full logic value on its gate terminal. As described earlier, VTT 270 is generated by an external VTT generator. However, an average value of VTT 270 is also at least partially derived from average transmitter currents being pushed and pulled to charge and discharge the external transmission lines by circuitry in the transmitters.

In some embodiments, the nmos transistor MUN1 224 makes the parallel combination of the nmos transistors 222 and 224 stronger than the pmos transistor MUP0 220. Therefore, the threshold voltage for the first inverter in the first group, which includes transistors 220, 222 and 224, is lower than the threshold voltage for the other transistors in generator 200. Similarly, in some embodiments, the pmos transistor MDP1 242 makes the parallel combination of the pmos transistors 240 and 242 stronger than the nmos transistor MDN0 244. Therefore, the threshold voltage for the first inverter in the second group, which includes transistors 240, 242 and 244, is lower (less negative) than the threshold voltage for the other transistors in generator 200.

The threshold voltages for each of the transistors in generator 200 is a fraction of the power supply voltage VIN 202. In one embodiment, the threshold voltage for each of the transistors in generator 200 is one half of the power supply voltage VIN 202. In various embodiments, when VTT 270 has a voltage equal to an expected voltage value, such as the transistor threshold voltage, which is one half of the power supply voltage VIN 202 in one example, each of the pmos transistor 210 and nmos transistor 212 is turned off and not conducting. Additionally, each of the pmos transistor 210 and nmos transistor 212 remain turned off and not conducting when VTT 270 deviates from the expected voltage value by less than a threshold.

In one example, the power supply voltage VIN 202 is 0.8V, the transistor threshold is one half of the power supply voltage, or 0.4V, and the threshold for noise on VTT 270 for turning on transistors 210 and 212 is 0.08V. Therefore, when VTT 270 deviates from 0.4V by more than 0.08V (exceeds 0.48V or falls below 0.32V), one of the transistors 210 and 212 is turned on and conducts. Within the threshold, such as 0.32V to 0.48V, the transistors 210 and 212 are turned off and not conducting. This range of voltages is referred to as a "deadband" where no current is conducted through transistors 210 and 212.

In some embodiments, the expected value of VTT 270 is a predetermined fraction of the supply voltage VIN 202. In various embodiments, the fraction is one half. In one embodiment, when noise causes VTT 270 to fall below the expected value by a threshold, the four inverters in the first group of serially connected inverters provide a logic low value on the gate terminal of pmos transistor 210. In one example, noise causes VTT 270 to fall from an expected voltage value of 0.40V to 0.31V. Since the difference, which is 0.09V, is greater than the threshold of 0.08V, the nmos transistors MUN0 222 and MUN1 224 either do not turn on, or they are outdriven by the pmos transistor MUP0 220. The voltage on the input to inverter 230 is increased past the transistor threshold such as one half of the power supply voltage VIN 202. The increased difference is amplified and inverted by each of the inverters 232 and 234 until a full logic low value is on the gate terminal of output pmos transistor 210. Output pmos transistor 210 is turned on, conducts, and charges node 214. Accordingly, VTT 270 rises from 0.31V to higher than 0.32V. In the deadband, pmos transistor 210 turns off again.

In some embodiments, the expected value of VTT 270 is a predetermined fraction of the supply voltage VIN 202. In various embodiments, the fraction is one half. In a similar manner as above, when noise causes VTT 270 to exceed the expected value by a threshold, the four inverters in the second group of serially connected inverters provide a logic high value on the gate terminal of nmos transistor 212. In one example, noise causes VTT 270 to rise above an expected voltage value of 0.40V to 0.49V. Since the difference, which is 0.09V, is greater than the threshold of 0.08V, the pmos transistors MDP0 240 and MDP1 242 either do not turn on, or they are outdriven by the nmos transistor MDN0 244. The voltage on the input to inverter 250 is decreased below the transistor threshold such as one half of the power supply voltage VIN 202. The decreased difference is amplified and inverted by each of the inverters 252 and 254 until a full logic high value is on the gate terminal of output nmos transistor 212. Output nmos transistor 212 is turned on, conducts, and discharges node 214. Accordingly, VTT 270 falls from 0.49V to lower than 0.48V. In the deadband, nmos transistor 212 turns off again.

Figure 3:
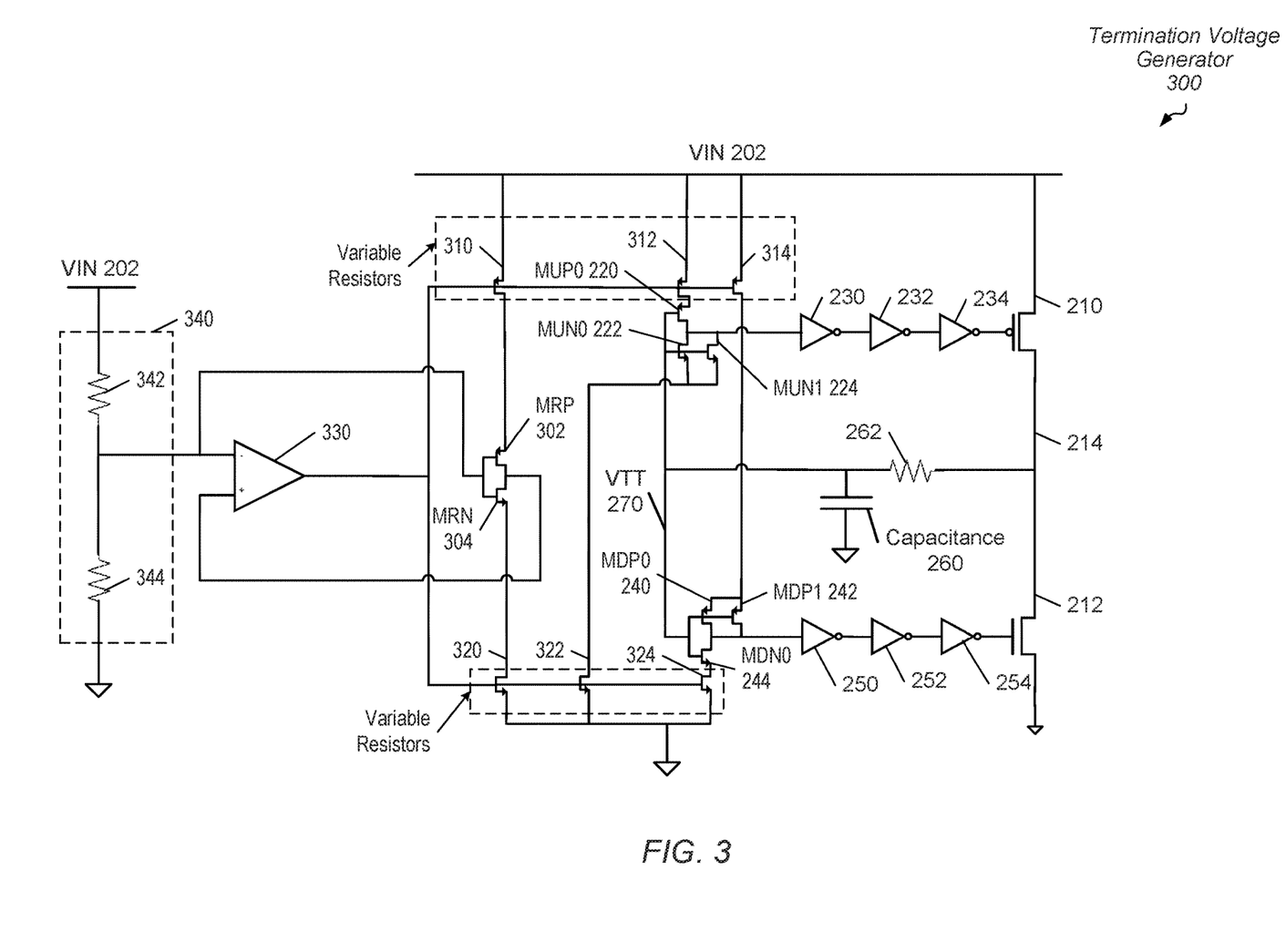
FIG. 3 is a block diagram of another embodiment of a termination voltage generator.

Referring now to FIG. 3, a generalized block diagram of another embodiment of a termination voltage generator 300 is shown. Circuits and devices previously described are numbered identically. In the illustrated embodiment, termination voltage generator 300 (or generator 300) includes a replica inverter with transistors 302, 304, 310 and 320, amplifier 330 and voltage divider 340 with resistors 342 and 344. In addition, generator 300 includes pmos transistors 312 and 314 in paths with the power supply voltage VIN 202 and nmos transistors 322 and 324 in paths with the ground reference voltage.

Due to semiconductor process variation, the inverter-based chopper circuit used in the previous generator 200 has changing transistor threshold voltages, which change VTT 270 from its expected value in addition to signal noise (e.g., cross capacitance) changing VTT 270. Therefore, pmos transistor 312 is used in generator 300 to adjust the source voltage of pmos transistor MUP0 220. In a similar manner, nmos transistor 322 is used in generator 300 to adjust the source voltage of each of nmos transistors MUN0 222 and MUN1 224. The gate terminals of pmos transistor 312 and nmos transistor 322 receive the output voltage of amplifier 330.

In a similar manner as described above, pmos transistor 314 is used in generator 300 to adjust the source voltages of pmos transistors MDP0 240 and MDP1 242. The nmos transistor 324 is used in generator 300 to adjust the source voltage of nmos transistors MDN0 244. The gate terminals of pmos transistors 310-314 and nmos transistors 320-324 receive the output voltage of amplifier 330. Using the topology shown in generator 300, pmos transistors 310-314 and nmos transistors 320-324 are used as variable resistors. The resistance values of these variable resistors 310-314 and 320-324 are set by the output voltage of amplifier 330. Amplifier 330 compares the output voltage of voltage divider 340 to the output voltage of the replica inverter formed by transistors 302, 304, 310 and 320. In one embodiment, amplifier 330 is a differential amplifier. In other embodiments, amplifier 330 is a complementary metal oxide semiconductor (CMOS) logic gate.

In various embodiments, resistors 342 and 344 are chose to have the same resistance values, so the output voltage of voltage divider 340 is one half of the supply voltage VIN 202. In other embodiments, resistance values for resistors 342 and 344 are chosen to generate a different fraction of the supply voltage VIN 202 on the output of voltage divider 340. Therefore, in some embodiments, the input voltage on the gate terminals of pmos transistor 302 and nmos transistor 304 of the replica inverter is held at a fraction of the power supply voltage VIN 202. In some embodiments, the fraction is one half. In various embodiments, pmos transistor 302 and nmos transistor 304 of the replica inverter have the same sizes as pmos transistor MUP0 220 and nmos transistor MUN0 222, which receive the output voltage of the chopper circuit (VTT 270). In various embodiments, pmos transistor 302 and nmos transistor 304 of the replica inverter have the same sizes as pmos transistor MUP0 220 and nmos transistor MUN0 222, which also have the same sizes as pmos transistor MDP0 240 and nmos transistor MDN0 244.

Based on the output voltage of pmos transistor 302 and nmos transistor 304 of the replica inverter, amplifier 330 adjusts the voltages on the gate terminals of pmos transistor 310 and nmos transistor 320, which adjusts the voltages at the drain terminals of pmos transistor 310 and nmos transistor 320. If semiconductor fabrication process variation and/or operating temperature cause the threshold voltages of pmos transistors to change, then the voltages at the drain terminal of pmos transistor 310 is adjusted by amplifier 330 to accommodate the change. If semiconductor fabrication process variation and/or operating temperature cause the threshold voltages of nmos transistors to change, then the voltages at the drain terminal of nmos transistor 320 is adjusted by amplifier 330 to accommodate the change. Using the topology shown in generator 300, pmos transistor 310 and nmos transistor 320 (as well as transistors 312, 314, 322 and 324) are used as variable resistors. The resistance values of these variable resistors 310 and 320 is set by the output voltage of amplifier 330.

As described earlier, in various embodiments, pmos transistor 302 and nmos transistor 304 of the replica inverter have the same sizes as pmos transistor MUP0 220 and nmos transistor MUN0 222, which also have the same sizes as pmos transistor MDP0 240 and nmos transistor MDN0 244. Accordingly, the voltage adjustments on the drain terminals of pmos transistor 310 and nmos transistor 320 also occur on the drain terminals of pmos transistors 312 and 314 as well as nmos transistor 322 and 324. Therefore, the threshold voltage of the first inverter in the first group (transistors 220-224) and the threshold voltage of the first inverter in the second group (transistors 240-244) remains at VTT 270. In an embodiment, this threshold voltage is one half of the power supply voltage VIN 202.

Figure 4:
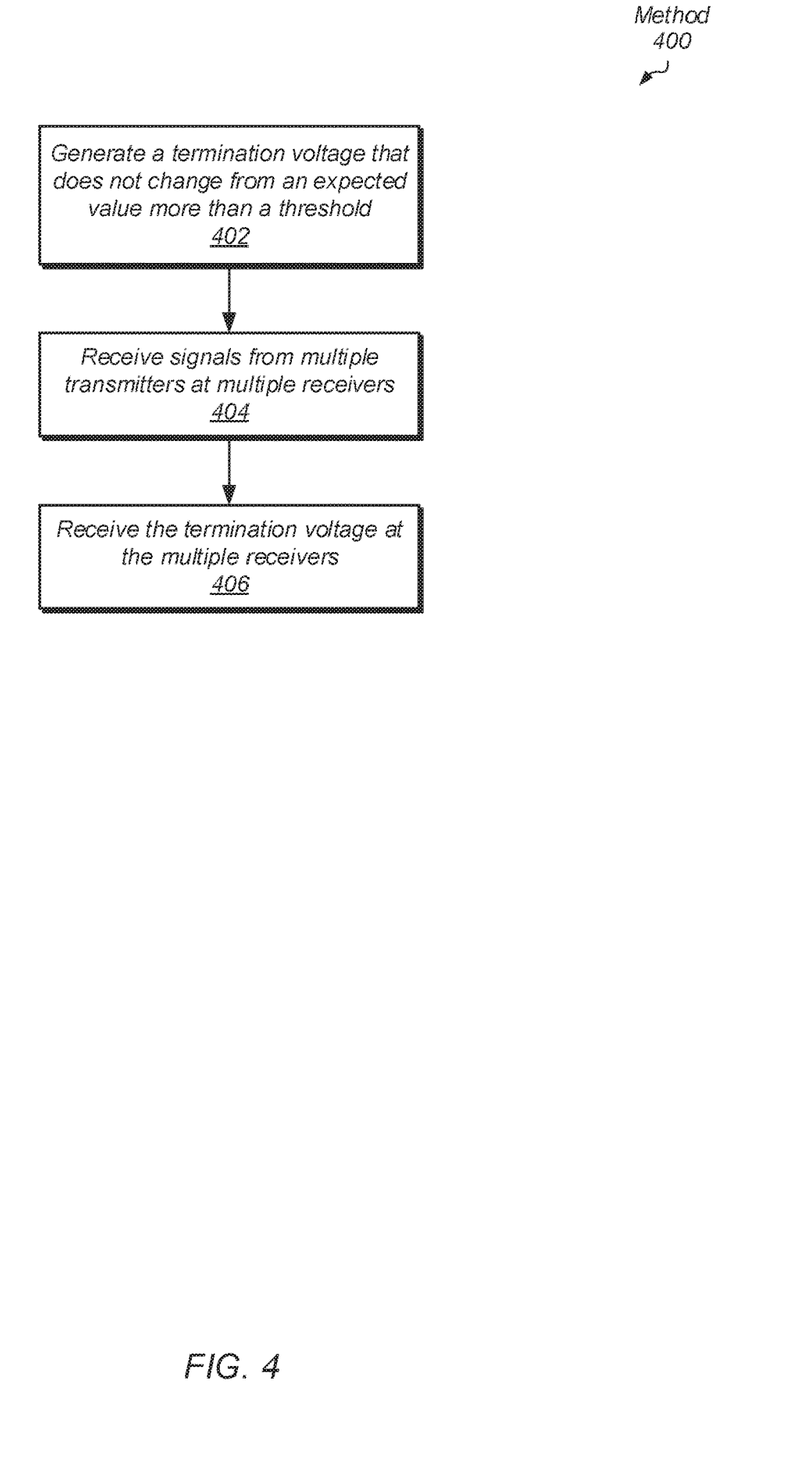
FIG. 4 is a flow diagram of another embodiment of a method for receiving information as signals in a computing system.

Referring now to FIG. 4, one embodiment of a method 400 for receiving information as signals in a computing system is shown. For purposes of discussion, the steps in this embodiment (as well as in FIGS. 5-7) are shown in sequential order. However, it is noted that in various embodiments of the described methods, one or more of the elements described are performed concurrently, in a different order than shown, or are omitted entirely. Other additional elements are also performed as desired. Any of the various systems or apparatuses described herein are configured to implement method 400.

A termination voltage is generated that does not change from an expected value more than a threshold (block 402). In various embodiments, a termination voltage generator includes an inverter-based chopper circuit with circuitry to adjust source voltages of transistors, which receive the termination voltage. In various embodiments, these transistors are in a first inverter in a group of serially connected inverters between the input and output of the chopper circuit.

Signals are received at multiple receivers from multiple transmitters (block 404). The termination voltage is received at the multiple receivers (block 406). As described earlier, the average value of the termination voltage is at least partially derived from average transmitter currents being pushed and pulled to charge and discharge the transmission lines by circuitry in the transmitters. Due to the adjustment of the voltages at the source terminals of the inverter transistors in the termination voltage generator, variation in transistor threshold voltages due to semiconductor fabrication process variation and/or operating temperature are compensated. This compensation allows the termination voltage to remain at an expected voltage within a tolerance or threshold.

Figure 5:
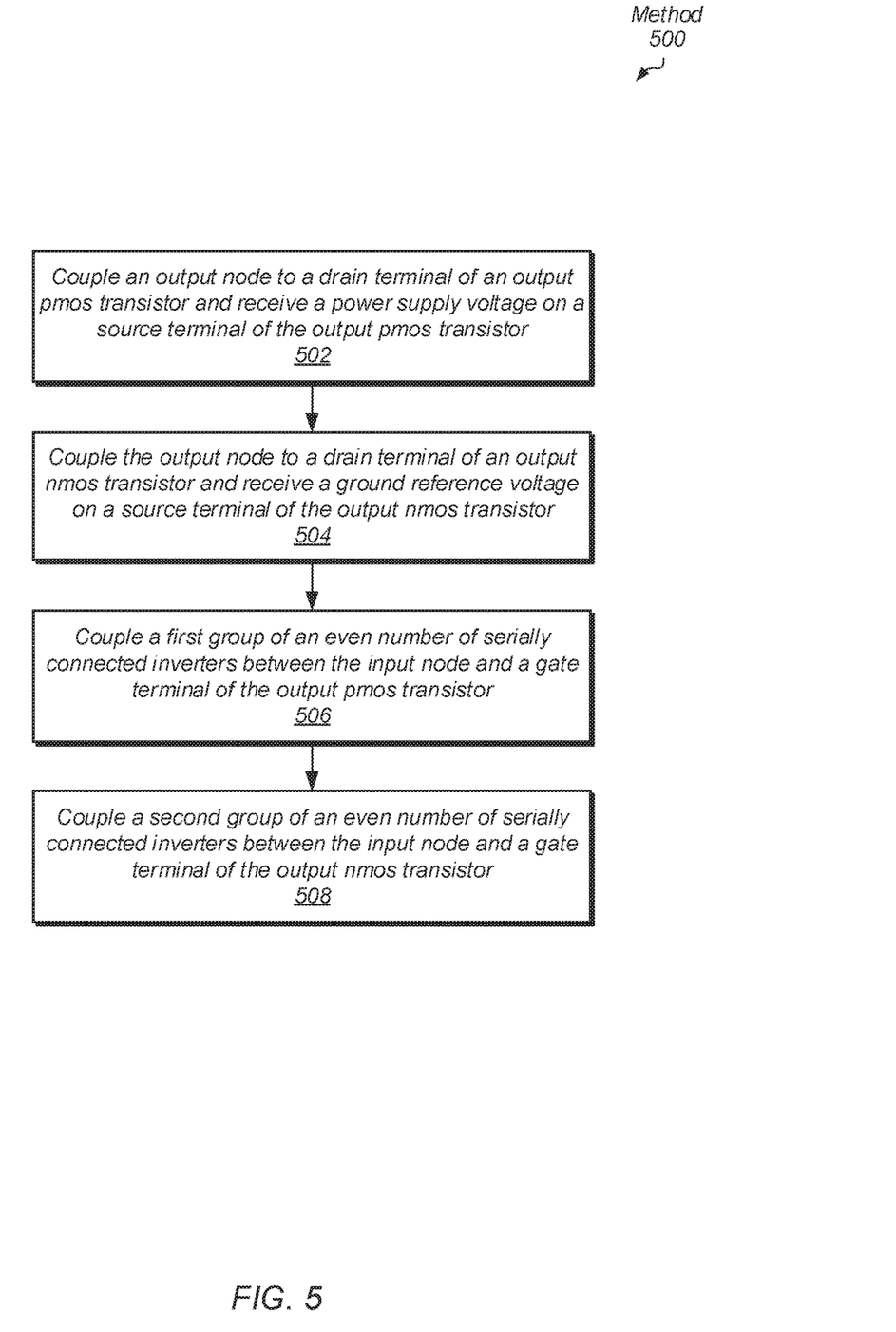
FIG. 5 is a flow diagram of another embodiment of a method for generating a termination voltage.

Referring now to FIG. 5, one embodiment of a method 500 for generating a termination voltage. is shown. An output node is coupled to a drain terminal of an output pmos transistor and a power supply voltage is received on a source terminal of the output pmos transistor (block 502). The output node is coupled to a drain terminal of an output nmos transistor and a ground reference voltage is received on a source terminal of the output nmos transistor (block 504).

A first group of an even number of serially connected inverters is coupled between the input node and a gate terminal of the output pmos transistor (block 506). A second group of an even number of serially connected inverters is coupled between the input node and a gate terminal of the output nmos transistor (block 508). Therefore, an odd number of logic transitions exist from the output node, which stores the termination voltage, to the output node in a loop. When the termination voltage begins to deviate from its expected value past a threshold amount, the odd number of inversions provided by the inverter-based chopper circuit compensates for the deviation and returns the output voltage on the output node to the expected value.

Figure 6:
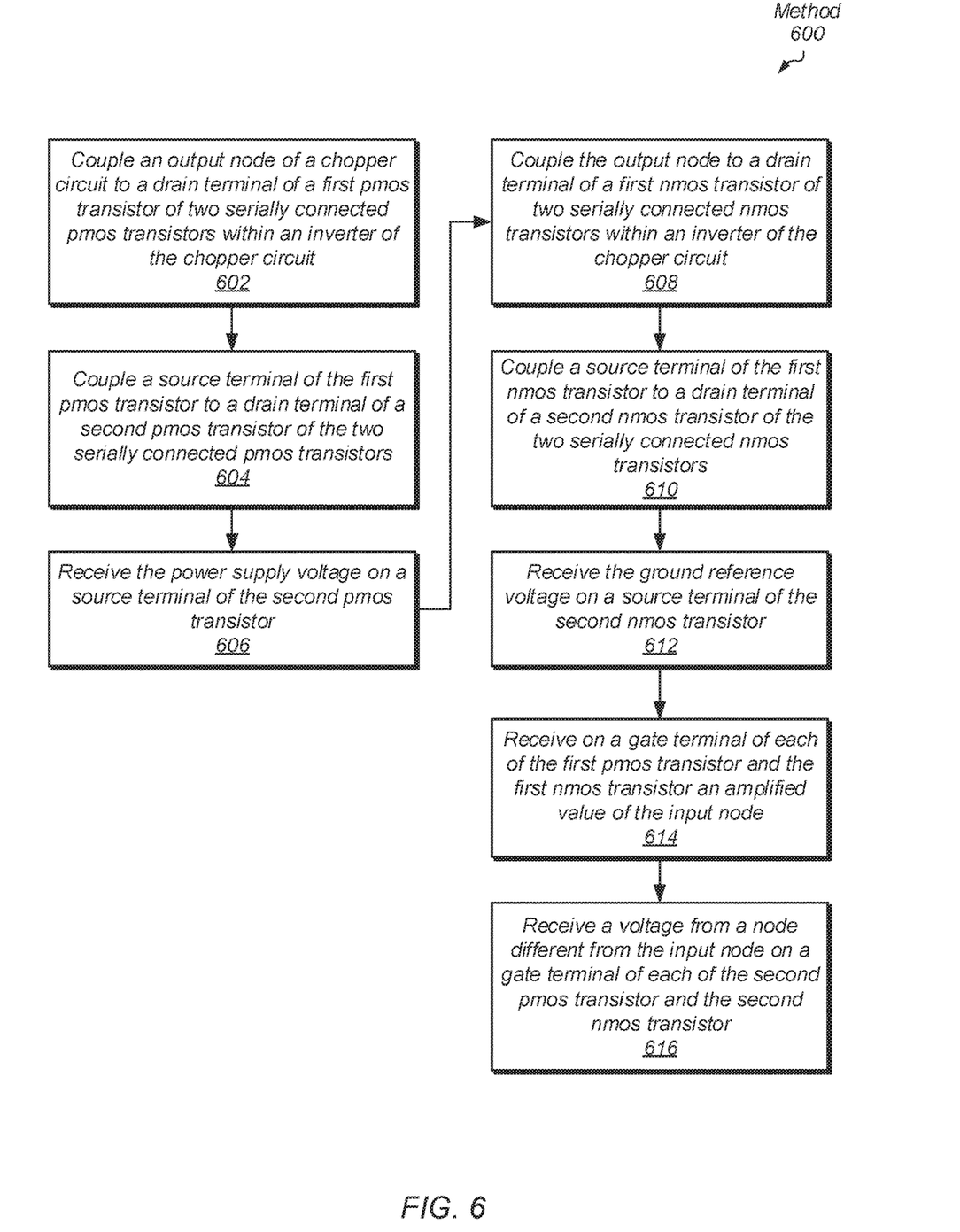
FIG. 6 is a flow diagram of another embodiment of a method for generating a termination voltage.

Referring now to FIG. 6, one embodiment of a method 600 for generating a termination voltage is shown. An output node of a chopper circuit is coupled to a drain terminal of a first pmos transistor of two serially connected pmos transistors within an inverter of the chopper circuit (block 602). A source terminal of the first pmos transistor is coupled to a drain terminal of a second pmos transistor of the two serially connected pmos transistors (block 604). The power supply voltage is received on a source terminal of the second pmos transistor (block 606). The second pmos transistor is used to adjust the voltage on the source terminal of the first pmos transistor. When semiconductor fabrication process variation and/or operating temperature changes the threshold voltage of pmos transistors, the second pmos transistor compensates for it.

The output node is coupled to a drain terminal of a first nmos transistor of two serially connected nmos transistors within an inverter of the chopper circuit (block 608). A source terminal of the first nmos transistor is coupled to a drain terminal of a second nmos transistor of the two serially connected nmos transistors (block 610). The ground reference voltage is received on a source terminal of the second nmos transistor (block 612). The second nmos transistor is used to adjust the voltage on the source terminal of the first nmos transistor. When semiconductor fabrication process variation and/or operating temperature changes the threshold voltage of nmos transistors, the second nmos transistor compensates for it.

An amplified value of the input node of the chopper circuit is received on a gate terminal of each of the first pmos transistor and the first nmos transistor (block 614). A voltage from a node different from the input node is received on a gate terminal of each of the second pmos transistor and the second nmos transistor (block 616). In various embodiments, the node different from the input node of the chopper circuit is an output of an amplifier. In some embodiments, the amplifier compares a fraction of the power supply voltage to an output of a replica inverter, which receives the fraction of the power supply voltage. In an embodiment, the fraction is one half. In various embodiments, the transistors within the replica inverter have same sizes as transistors in inverters within a chopper circuit where the inverters receive the input voltage on the input node of the chopper circuit.

Figure 7:
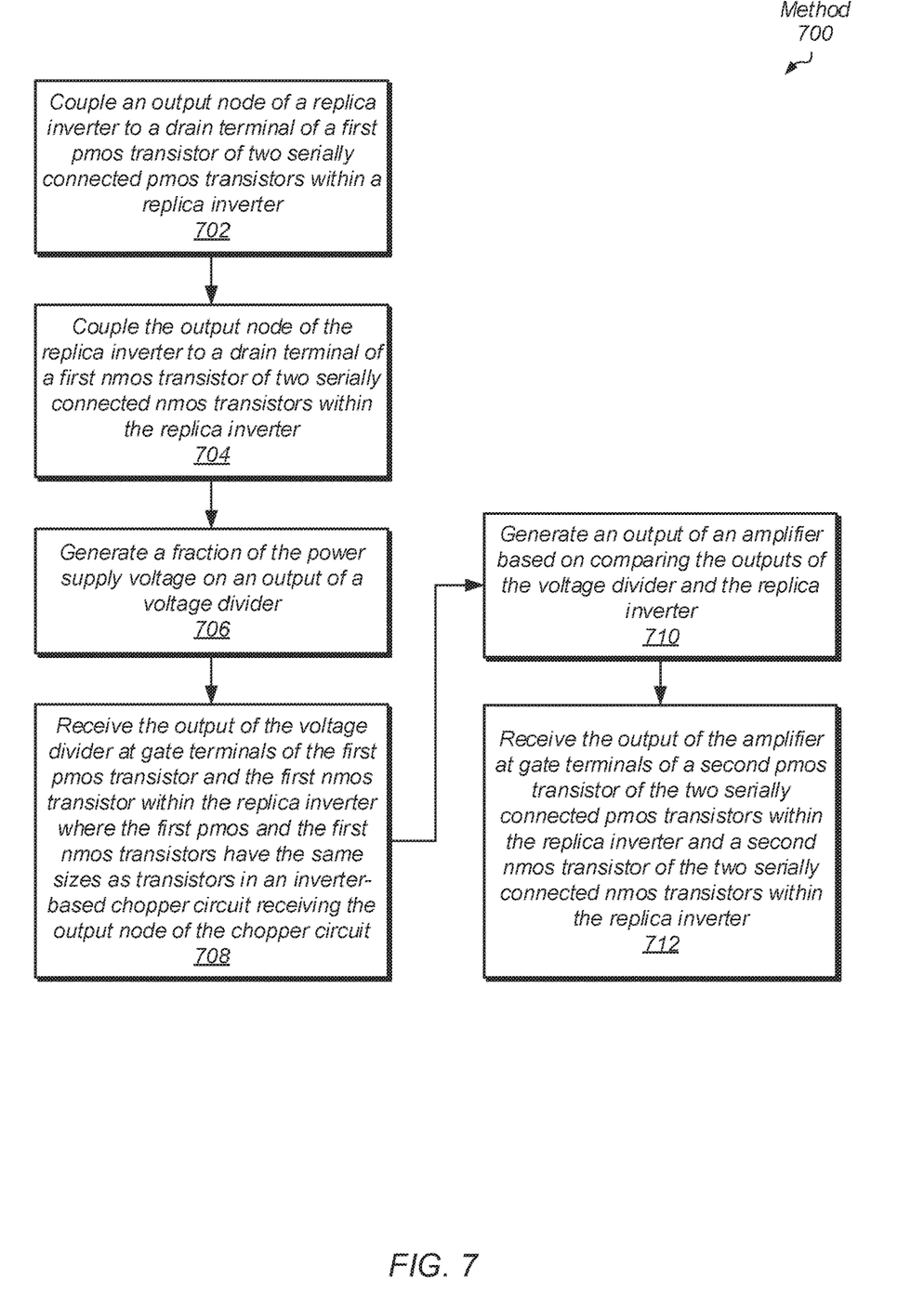
FIG. 7 is a flow diagram of another embodiment of a method for generating a termination voltage.

Referring now to FIG. 7, one embodiment of a method 700 for generating a termination voltage is shown. An output node of a replica inverter is coupled to a drain terminal of a first pmos transistor of two serially connected pmos transistors within a replica inverter (block 702). The output node of the replica inverter is coupled to a drain terminal of a first nmos transistor of two serially connected nmos transistors within the replica inverter (block 704). A fraction of the power supply voltage is generated on an output of a voltage divider (block 706).

The output of the voltage divider is received at gate terminals of the first pmos transistor and the first nmos transistor within the replica inverter where the first pmos and the first nmos transistors have the same sizes as transistors in an inverter-based chopper circuit receiving the output voltage on the output node of the chopper circuit (block 708). An output of an amplifier is generated based on comparing the outputs of the voltage divider and the replica inverter (block 710). The output of the amplifier is received at gate terminals of a second pmos transistor of the two serially connected pmos transistors within the replica inverter and a second nmos transistor of the two serially connected nmos transistors within the replica inverter (block 712).

Figure 8:
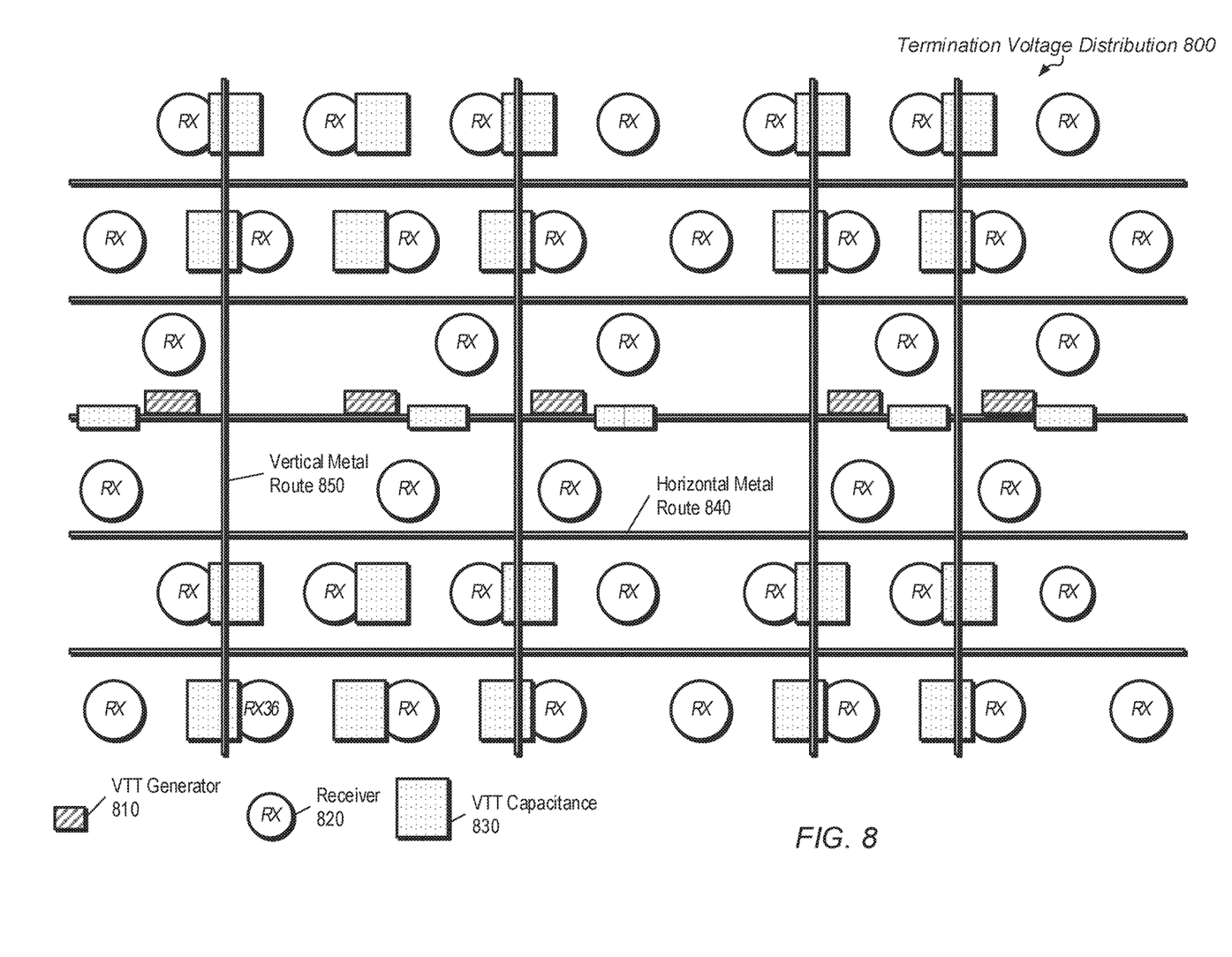
FIG. 8 is a block diagram of another embodiment of a termination voltage distribution.

Referring to FIG. 8, a generalized block diagram of one embodiment of a termination voltage distribution 800 is shown. As shown, termination voltage distribution 800 (or distribution 800) includes five VTT generators 810 (or generators 810). In some embodiments, one or more of generators 810 incorporate the topology and functionality of generators 300 (of FIG. 3). In another embodiment, one or more of generators 810 incorporate the topology and functionality of generators 900 (of FIG. 9), which are described later. In the illustrated embodiment, the five generators 810 are electrically shorted together using the horizontal metal routes 840 and the vertical metal routes 850.

In an embodiment, the horizontal metal routes 840 are a metal layer 12 and the vertical metal routes 850 are a metal layer 13. However, in other embodiments, another metal layer is used for one or more of the horizontal metal routes 840 and the vertical metal routes 850. Although five VTT generators 810 are shown, in other embodiments, another number of VTT generators 810 are used. As shown, the distribution 800 includes multiple VTT capacitances 830, which are used to reduce noise on the nodes with VTT 270 and keep VTT 270 as stable as possible. In some embodiments, one or more of the VTT capacitances 830 is distributed locally within one or more of the receivers 820.

In various embodiments, receivers 820 receive signals from transmitters (not shown) on a communication bus. In some embodiments, receivers 820 incorporate the functionality of receivers 130-144 (of FIG. 1). In an embodiment, each of the receivers 820 electrically connects to the termination voltage mesh created by horizontal metal routes 840 and the vertical metal routes 850, the VTT generators 810 and the VTT capacitances 820.

Figure 9:
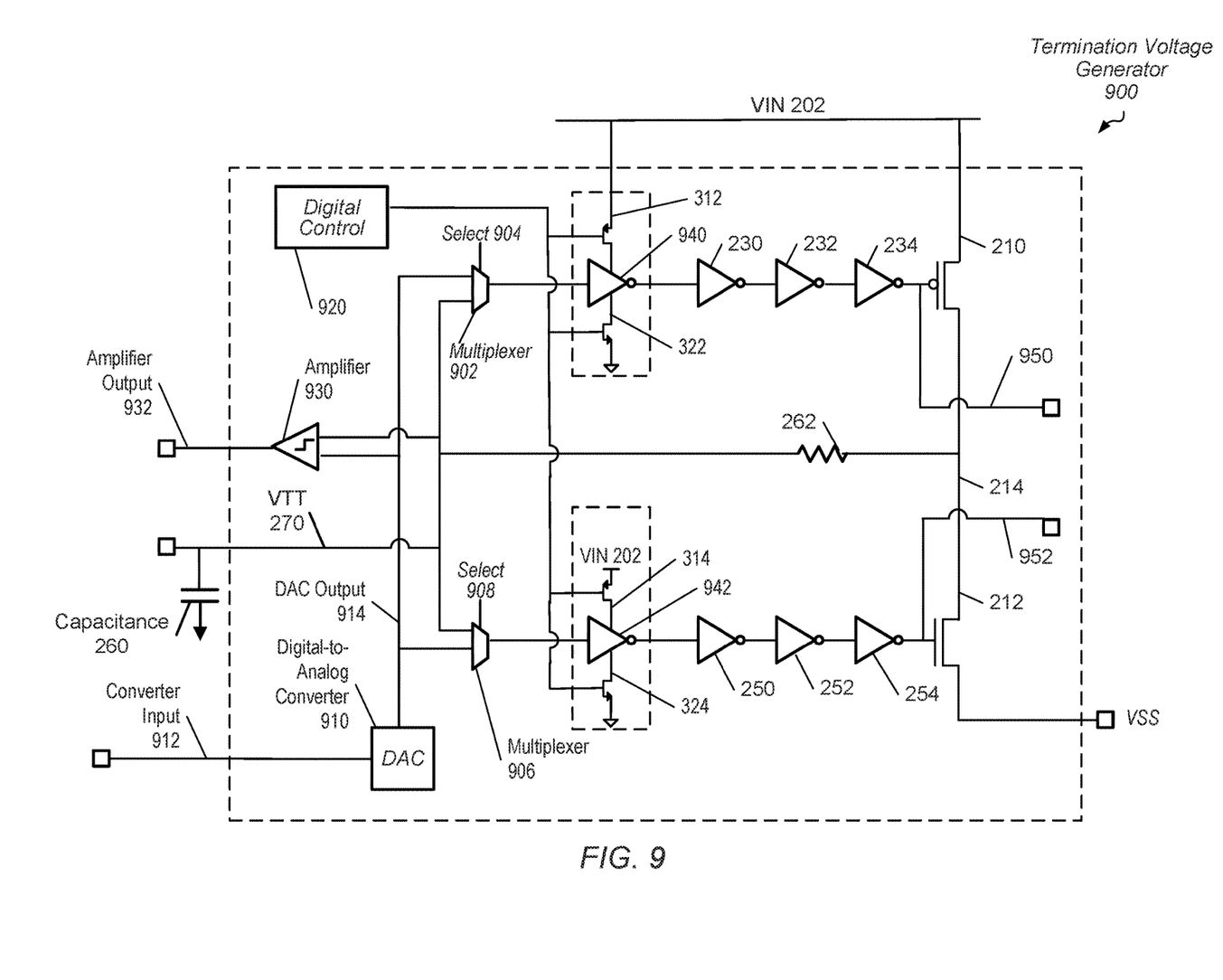
FIG. 9 is a block diagram of another embodiment of a termination voltage generator.

Referring now to FIG. 9, a generalized block diagram of another embodiment of a termination voltage generator 900 is shown. Circuits and devices previously described are numbered identically. In some embodiments, termination voltage generator 900 (or generator 900) uses two modes of operation. A first mode for generator 900 is a calibration mode and a second mode is an operation mode. The digital-to-analog converter (DAC) 910 receives updated values for the converter input 912 during the calibration mode. In addition, during the calibration mode, each of the select lines 904 and 908 are set in a manner to have multiplexers 902 and 906 send the DAC output 914 to the gate inputs of the inverters 940 and 942, rather than send VTT 270 to these gate inputs. In contrast, during the operation mode, each of the select lines 904 and 908 are set in a manner to have multiplexers 902 and 906 send VTT 270 to the gate inputs of the inverters 940 and 942.

In various embodiments, VTT 270 is expected to be a fraction of the supply voltage VIN 202. In some embodiments, VTT 270 is expected to be one half of the supply voltage VIN 202. During the calibration mode, the converter input 912 is set by logic (not shown) to generate the expected value for VTT 270. In an embodiment, the converter input 912 includes an 8-bit digital value. In other embodiments, another number of binary bits is used. The multiplexers 902 and 906 send the DAC output 914 to the first group of an even number of serially connected inverters 940 and 230-234 as well as the second group of an even number of serially connected inverters 942 and 250-254. The resulting values on the gate inputs of transistors 210 and 212 determine the value of node 214, which determines VTT 270.

Amplifier 930 compares the DAC output 914 to VTT 270. When the difference between the DAC output 914 and VTT 270 is below a threshold, the amplifier output 932 changes from a logic high value to a logic low value, in one embodiment, or vice-versa, in other embodiments. The change in value of the amplifier output 932 indicates that the difference is below the threshold, and the calibration mode has completed. In response, the select lines 904 and 908 have their values changed to send VTT 270 from multiplexers 902 and 906, which begins the operation mode.

As shown, inverter 940 includes variable resistors implemented by transistors 312 and 322. Similarly, inverter 942 includes variable resistors implemented by transistors 314 and 324. In the illustrated embodiment, the gate inputs of transistors 312, 314, 322 and 324, which are used as variable resistors, receive the output of digital control block 920. In some embodiments, the digital control block 920 uses the outputs of one or more on-die temperature sensors to generate an output. In an embodiment, the digital control block 920 receives the measurements of the one or more on-die temperature sensors and converts the received measurements into a digital code. The digital code is sent to a digital-to-analog converter, which sends its output to the gate inputs of transistors 312, 314, 322 and 324.

In an embodiment, the digital control block 920 has multiple outputs, rather than a single output, and one or more of the transistors 312, 314, 322 and 324 receive an output different from an output received by another one of the transistors 312, 314, 322 and 324. In various embodiments, the routing of the outputs is based on the on-die location of the transistors 312, 314, 322 and 324 as well as the one or more on-die temperature sensors. The resistance values of these variable resistors 312, 314, 322 and 324 are set by the output(s) of the digital control block 920.

In various embodiments, the nodes 950 and 952, which are the gate inputs of transistors 210 and 212, are monitored. The monitoring is used to determine whether VT 270 is deviating from its expected value by more than a threshold. For example, it is known when VTT 270 is at its expected value within a threshold, such as within the deadband range of voltages, node 950 is pulled to a logic high value and node 952 is pulled down to a logic low value. Accordingly, transistors 210 and 212 are turned off. However, when VTT 270 begins to pull low, such as a load due to the values on transmission lines have an appreciable number of values at a logic low value, then node 950 begins to switch with a given frequency. This frequency is used to determine the load.

The above frequency information is used by logic (not shown) to determine how the load is skewed. For example, is the load skewed toward pushing current on node 214 and increasing VTT 270, or is the load skewed toward pulling current from node 214 and decreasing VTT 270. In an embodiment, multiple thresholds are used for the frequency and duty cycle of one or more of nodes 950 and 952. When one or more of these thresholds are exceeded, in an embodiment, the values from digital control block 920 are adjusted to change the resistances of one more of the variable resistors 312, 314, 322 and 324. In another embodiment, when one or more of these thresholds are exceeded, the generator 900 reenters the calibration mode, and converter input 912 is adjusted to change the DAC output 914 to counteract the direction of VTT 270 determined by monitoring one or more of the nodes 950 and 952.

In various embodiments, program instructions of a software application are used to implement the methods and/or mechanisms previously described. The program instructions describe the behavior of hardware in a high-level programming language, such as C. Alternatively, a hardware design language (HDL) is used, such as Verilog. The program instructions are stored on a non-transitory computer readable storage medium. Numerous types of storage media are available. The storage medium is accessible by a computing system during use to provide the program instructions and accompanying data to the computing system for program execution. The computing system includes at least one or more memories and one or more processors that execute program instructions.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A circuit comprising:
   an output pmos transistor generating an output voltage on an output node with a drain terminal coupled to the output node and receiving a power supply voltage on a source terminal;
   a first plurality of serially connected inverters receiving the output voltage on the output node and generating a first intermediate voltage on a gate terminal of the output pmos transistor, wherein the first intermediate voltage is a non-inverting value of the output voltage; and
   wherein a first inverter of the first plurality of serially connected inverters comprises:
   a gate terminal of a first pmos transistor coupled to the output node, and
   a first variable resistor between a source terminal of the first pmos transistor and the power supply voltage, wherein a value of the first variable resistor is set based at least in part on an output of comparison circuitry comparing:
   a first voltage, wherein the first voltage is equal to the output voltage on the output node; and
   an output voltage of a replica inverter coupled to receive the first voltage, wherein the replica inverter is a replica of the first inverter.

2. The circuit as recited in claim 1, wherein the inverter in the first plurality of serially connected inverters further comprises:
   a gate terminal of a first nmos transistor coupled to the output node, and a second variable resistor between a source terminal of the first nmos transistor and the ground reference voltage, wherein a value of the second variable resistor is set based at least in part on the output of the comparison circuitry comparing:
the first voltage; and
the output voltage of the replica inverter.

3. The circuit as recited in claim 2, wherein the first variable resistor comprises a pmos transistor and the second variable resistor comprises an nmos transistor.

4. The circuit as recited in claim 1, further comprising:
an output nmos transistor generating the output voltage on the output node with a drain terminal coupled to the output node and receiving a ground reference voltage on a source terminal; and
a second plurality of serially connected inverters receiving the output voltage on the output node and generating a second intermediate voltage on a gate terminal of the output nmos transistor, wherein the second intermediate voltage is a non-inverting value of the output voltage.

5. The circuit as recited in claim 4, wherein an inverter in the second plurality of serially connected inverters comprises:
a gate terminal of a third pmos transistor coupled to the output node;
a third variable resistor between a source terminal of the third pmos transistor and the power supply voltage;
a gate terminal of a third nmos transistor coupled to the output node; and
a fourth variable resistor between a source terminal of the third nmos transistor and the ground reference voltage.

6. The circuit as recited in claim 3, wherein:
gate terminals of the pmos transistor of the first variable resistor and the nmos transistor of the second variable resistor receive an output voltage of an amplifier comparing the output of the replica inverter and half of the power supply voltage from a voltage divider,
wherein the replica inverter receives half of the power supply voltage from the voltage divider as an input.

7. The circuit as recited in claim 6, wherein the replica inverter comprises two serially connected pmos transistors and two serially connected nmos transistors.

8. The circuit as recited in claim 7, wherein transistors comprised within the replica inverter that receive half of the power supply voltage from the voltage divider on a gate terminal have same sizes as transistors receiving the output voltage on the output node on gate terminals within the first plurality of inverters.

9. The circuit as recited in claim 7, wherein transistors comprised within the replica inverter that do not receive half of the power supply voltage from the voltage divider on gate terminals instead receive the output of the amplifier on the gate terminals.

10. The circuit as recited in claim 4, wherein each of the first plurality of inverters and the second plurality of inverters comprises:
an even number of inverters, and
an inverter in a given stage has smaller transistor sizes than transistors in an inverter in a next stage receiving an output of the given stage as an input.

11. A method, comprising:
generating an output voltage on an output node with a drain terminal of an output pmos transistor and receiving a power supply voltage on a source terminal of the output pmos transistor;
receiving the output voltage on the output node with a first plurality of serially connected inverters;
generating a first intermediate voltage on a gate terminal of the output pmos transistor with the first plurality of serially connected inverters, wherein the first intermediate voltage is a non-inverting value of the output voltage;
coupling the output node to a gate terminal of a first pmos transistor of a first inverter of the first plurality of serially connected inverters; and
coupling a first variable resistor between a source terminal of the first pmos transistor and the power supply voltage, wherein a value of the first variable resistor is set based at least in part on an output of comparison circuitry comparing:
a first voltage, wherein the first voltage is equal to the output voltage on the output node; and
an output voltage of a replica inverter coupled to receive the first voltage, wherein the replica inverter is a replica of the first inverter.

12. The method as recited in claim 11, further comprising:
coupling the output node to a gate terminal of a first nmos transistor of the inverter in the first plurality of serially connected inverters; and
coupling a second variable resistor between a source terminal of the first nmos transistor and the ground reference voltage, wherein a value of the second variable resistor is set based at least in part on the output of the comparison circuitry comparing:
the first voltage; and
the output voltage of the replica inverter.

13. The method as recited in claim 12, wherein the first variable resistor comprises a pmos transistor and the second variable resistor comprises an nmos transistor.

14. The method as recited in claim 11, further comprising:
generating the output voltage on the output node with a drain terminal of an output nmos transistor and receiving a ground reference voltage on a source terminal of the output nmos transistor;
receiving the output voltage on the output node with a second plurality of serially connected inverters; and
generating a second intermediate voltage on a gate terminal of the output nmos transistor with the second plurality of serially connected inverters, wherein the second intermediate voltage is a non-inverting value of the output voltage.

15. The method as recited in claim 13, further comprising:
receiving an output voltage of an amplifier with gate terminals of the pmos transistor of the first variable resistor and the nmos transistor of the second variable resistor, wherein the amplifier compares the output of the replica inverter and half of the power supply voltage from a voltage divider,
wherein the replica inverter receives half of the power supply voltage from the voltage divider as an input.

16. The method as recited in claim 15, wherein the replica inverter comprises two serially connected pmos transistors and two serially connected nmos transistors.

17. An apparatus comprising:
a plurality of receivers configured to receive signals;
a plurality of transmitters configured to send a plurality of signals to the plurality of receivers;
a termination voltage generator configured to generate a termination voltage on an output node;
wherein each of the plurality of receivers is configured to receive the termination voltage from the output node of the termination voltage generator;

wherein the termination voltage generator comprises:
   an output pmos transistor generating an output voltage on an output node with a drain terminal coupled to the output node and receiving a power supply voltage on a source terminal;
   a first plurality of serially connected inverters receiving the output voltage on the output node and generating a first intermediate voltage on a gate terminal of the output pmos transistor, wherein the first intermediate voltage is a non-inverting value of the output voltage; and
   wherein a first inverter of the first plurality of serially connected inverters comprises:
      a gate terminal of a first pmos transistor coupled to the output node, and
      a first variable resistor between a source terminal of the first pmos transistor and the power supply voltage, wherein a value of the first variable resistor is set based at least in part on an output of comparison circuitry comparing:
         a first voltage, wherein the first voltage is equal to the output voltage on the output node; and
         an output voltage of a replica inverter coupled to receive the first voltage, wherein the replica inverter is a replica of the first inverter.

18. The apparatus as recited in claim 17, wherein the inverter in the first plurality of serially connected inverters further comprises:
   a gate terminal of a first nmos transistor coupled to the output node, and
   a second variable resistor between a source terminal of the first nmos transistor and the ground reference voltage, wherein a value of the second variable resistor is set based at least in part on the output of the comparison circuitry comparing:
      the first voltage; and
      the output voltage of the replica inverter.

19. The apparatus as recited in claim 18, wherein the first variable resistor comprises a pmos transistor and the second variable resistor comprises an nmos transistor.

20. The apparatus as recited in claim 19, wherein:
   gate terminals of the pmos transistor of the first variable resistor and the nmos transistor of the second variable resistor receive an output voltage of an amplifier comparing the output of the replica inverter and half of the power supply voltage from a voltage divider,
   wherein the replica inverter receives half of the power supply voltage from the voltage divider as an input.

* * * * *